US011354243B1

(12) United States Patent
Williams et al.

(10) Patent No.: US 11,354,243 B1
(45) Date of Patent: Jun. 7, 2022

(54) ACCELERATED PROCESSING OF STREAMS OF LOAD-RESERVE REQUESTS

(71) Applicant: INTERNATIONAL BUSINESS MACHINES CORPORATION, Armonk, NY (US)

(72) Inventors: Derek E. Williams, Round Rock, TX (US); Guy L. Guthrie, Austin, TX (US); Hugh Shen, Round Rock, TX (US); Sanjeev Ghai, Round Rock, TX (US); Luke Murray, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/950,511

(22) Filed: Nov. 17, 2020

(51) Int. Cl.
*G06F 12/08* (2016.01)
*G06F 13/40* (2006.01)
*G06F 9/30* (2018.01)
*G06F 12/0815* (2016.01)
*G06F 30/327* (2020.01)
*G06F 30/33* (2020.01)

(52) U.S. Cl.
CPC ...... *G06F 12/0815* (2013.01); *G06F 9/30043* (2013.01); *G06F 13/4027* (2013.01); *G06F 30/327* (2020.01); *G06F 30/33* (2020.01); *G06F 2212/1032* (2013.01)

(58) Field of Classification Search
CPC .... G06F 12/0815; G06F 30/33; G06F 30/327; G06F 9/30043; G06F 13/4027; G06F 2212/1032
USPC .......................................................... 711/146
See application file for complete search history.

(56) References Cited

U.S. PATENT DOCUMENTS

| | | | |
|---|---|---|---|
| 9,304,936 B2 | 4/2016 | Ghai et al. | |
| 9,367,264 B2 | 6/2016 | Frey et al. | |
| 10,691,599 B1* | 6/2020 | Williams | G06F 12/0833 |
| 11,106,608 B1* | 8/2021 | Williams | G06F 30/32 |
| 2006/0085603 A1* | 4/2006 | Guthrie | G06F 9/30072 |
| | | | 711/E12.024 |
| 2006/0085604 A1* | 4/2006 | Guthrie | G06F 9/30072 |
| | | | 711/E12.024 |

(Continued)

OTHER PUBLICATIONS

Google: Design of the IBM Blue Gene/Q Compute Chip, Ohmacht, M. et al.; Jan. 2013.

(Continued)

*Primary Examiner* — Christopher B Shin
(74) *Attorney, Agent, or Firm* — Brian F. Russell; Nathan Rau

(57) ABSTRACT

A processing unit for a data processing system includes a processor core that issues memory access requests and a cache memory coupled to the processor core. The cache memory includes a reservation circuit that tracks reservations established by the processor core via load-reserve requests and a plurality of read-claim (RC) state machines for servicing memory access requests of the processor core. The cache memory, responsive to receipt from the processor core of a store-conditional request specifying a store target address, allocates an RC state machine among the plurality of RC state machines to process the store-conditional request and transfers responsibility for tracking a reservation for the store target address from the reservation circuit to the RC state machine.

21 Claims, 13 Drawing Sheets

(56) References Cited

U.S. PATENT DOCUMENTS

| | | | | |
|---|---|---|---|---|
| 2006/0085605 A1* | 4/2006 | Guthrie | ............... | G06F 9/30072 |
| | | | | 712/E9.047 |
| 2006/0090035 A1* | 4/2006 | Guthrie | ................ | G06F 9/3824 |
| | | | | 712/E9.046 |
| 2006/0212653 A1* | 9/2006 | Alexander | ............ | G06F 9/3834 |
| | | | | 711/E12.024 |
| 2007/0033345 A1* | 2/2007 | Guthrie | ................ | G06F 9/3834 |
| | | | | 711/E12.024 |
| 2011/0161590 A1* | 6/2011 | Guthrie | ............... | G06F 12/0811 |
| | | | | 711/144 |
| 2015/0161053 A1* | 6/2015 | Ghai | .................. | G06F 12/0833 |
| | | | | 711/122 |
| 2015/0161054 A1* | 6/2015 | Ghai | .................. | G06F 12/0895 |
| | | | | 711/138 |
| 2015/0242327 A1* | 8/2015 | Guthrie | ............... | G06F 12/0891 |
| | | | | 711/122 |
| 2017/0293558 A1* | 10/2017 | Guthrie | ............... | G06F 12/0831 |
| 2020/0034146 A1* | 1/2020 | Williams | ............... | G06F 9/3004 |
| 2020/0034312 A1* | 1/2020 | Williams | ............... | G06F 12/084 |
| 2020/0133973 A1* | 4/2020 | Justin | ...................... | G06F 16/40 |
| 2020/0150960 A1* | 5/2020 | Williams | ................... | G06F 9/38 |
| 2020/0183696 A1* | 6/2020 | Williams | ............. | G06F 12/0811 |
| 2020/0201765 A1* | 6/2020 | Williams | ............. | G06F 12/0833 |
| 2020/0201766 A1* | 6/2020 | Williams | ............. | G06F 12/0808 |
| 2020/0356409 A1* | 11/2020 | Williams | ............. | G06F 12/0811 |

OTHER PUBLICATIONS

Google: Making Lockless Synchronization Fast: Performance Implications of Memory Reclamation, McKenney, P. et al.; Jan. 2006.

ip.com: Dual Renaming Mode of Accumulator Register for Dense Math Engine (Matrix-Multiple-Add) Execution, Anonymously; Jul. 27, 2020.

ip.com: Apparatus for Interleaving Execution of Distinct Conditional Branches, Anonymously; Feb. 2, 2012.

ip.com: Apparatus for Interleaving Execution of Distinct Conditional Vector-Branches Using Multidimensional Field Condition Registers, Anonymously; Feb. 2, 2012.

* cited by examiner

```
loop:
    larx r1, lock    —230
    cmp r1, 1        —232   ⎫
    beq loop         —234   ⎬ 214
    li r2, 1         —236   ⎪
    stcx lock, r2    —238   ⎪
    beq loop         —239   ⎭ barrier          —240   ⎫
    ...                     ⎬ 216
    (critical section       ⎪
     instructions)   —242   ⎪
    ...                     ⎪
    barrier          —244   ⎭ li r2, 0         —250   ⎫
    store lock, r2   —252   ⎬ 218
                            ⎭
```

FIG. 2B

```
loop:
    larx r1, var     —202
    add  r1, 1       —204
    stcx var, r1     —206
    beq loop         —208
```

FIG. 2A

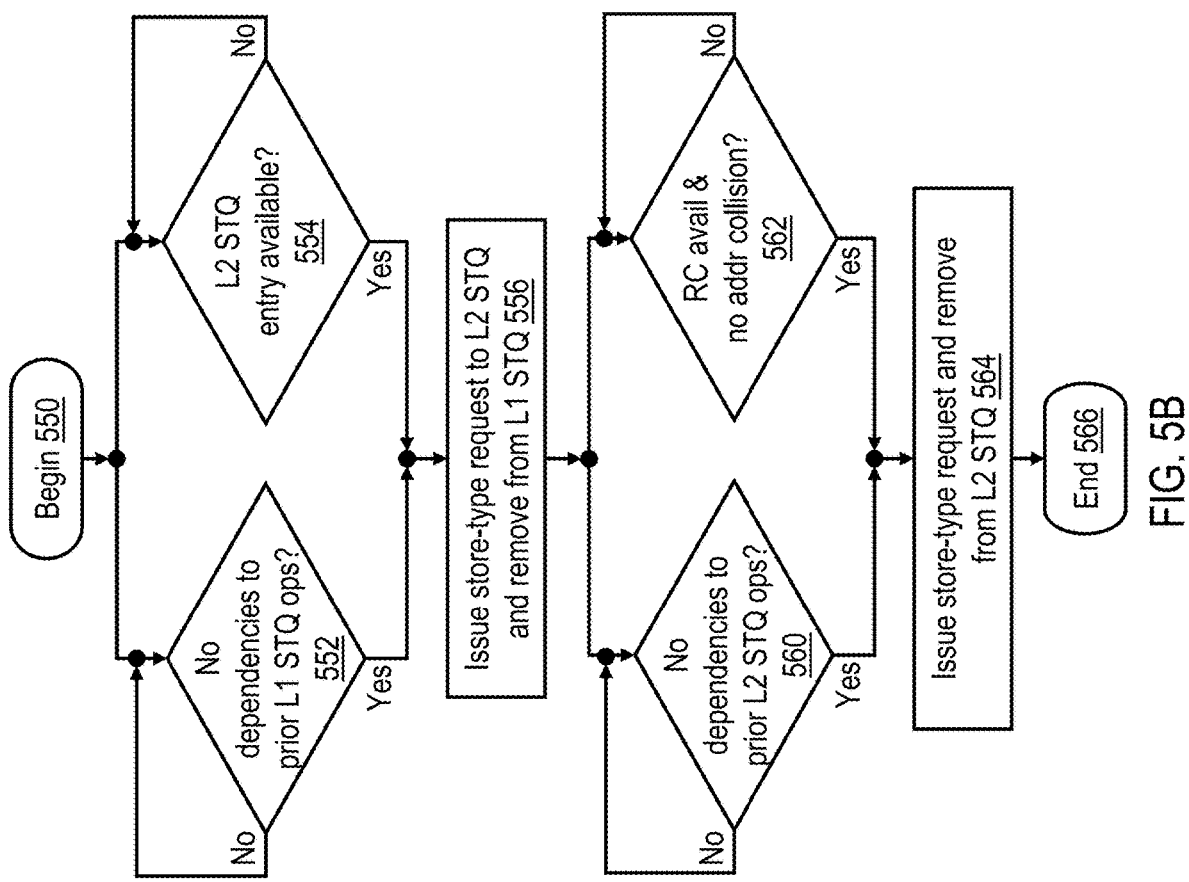

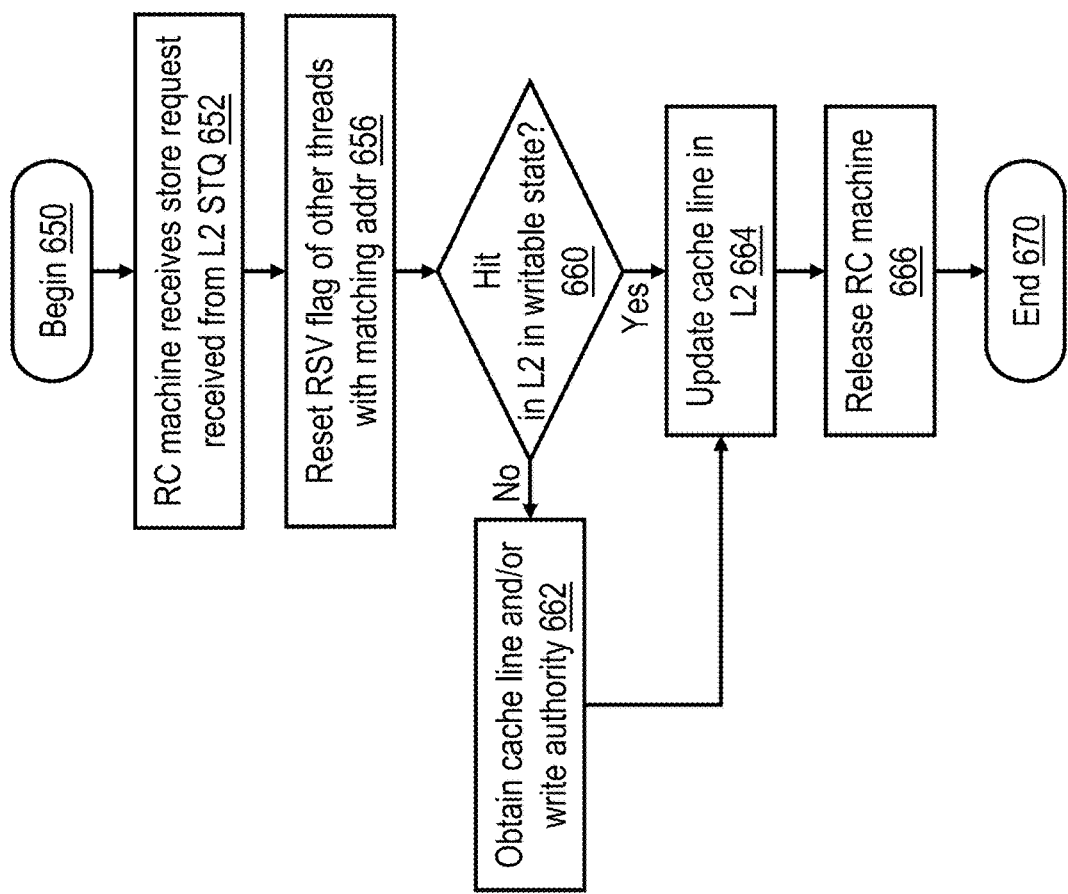

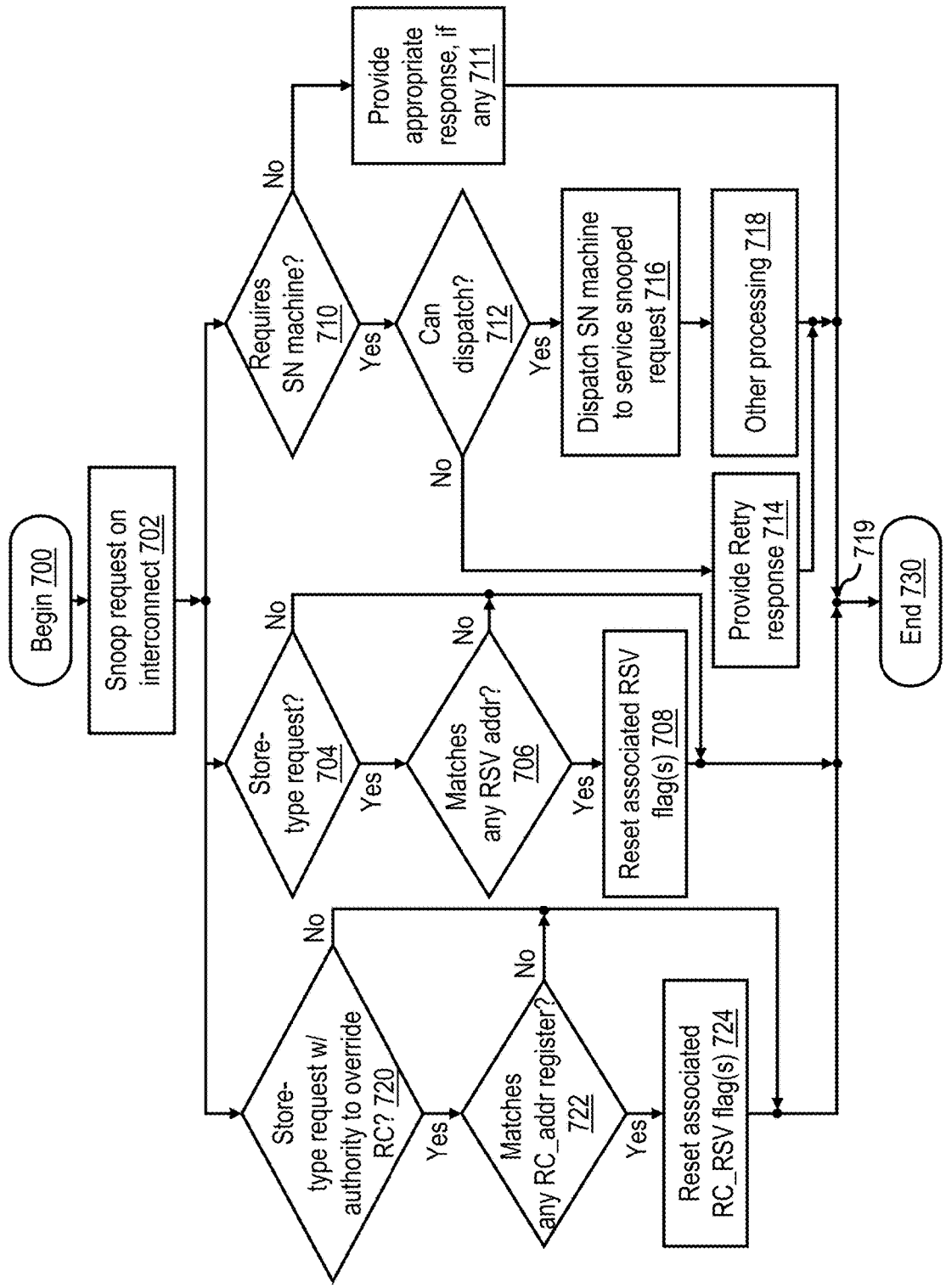

ACCELERATED PROCESSING OF STREAMS OF LOAD-RESERVE REQUESTS

BACKGROUND OF THE INVENTION

The present invention relates in general to data processing system and, in particular, to managing accesses to data in shared memory of a data processing system. Still more particularly, the present invention relates to a processor, data processing system and method for synchronizing accesses to data in a shared memory.

In shared memory multiprocessor (MP) data processing systems, each of the multiple processors in the system may access and modify data stored in the shared memory. In order to synchronize access to a particular granule (e.g., cache line) of memory between multiple processing units and threads of execution, load-reserve and store-conditional instruction pairs are often employed. For example, load-reserve and store-conditional instructions have been implemented in the POWER® instruction set architecture with request codes (opcodes) associated with various mnemonics, referred to herein generally as LARX and STCX. The goal of load-reserve and store-conditional instruction pairs is to load and modify data and then to commit the modified data to coherent memory only if no other thread of execution has modified the data in the interval between the load-reserve and store-conditional instructions. Thus, a read-modify-write operation targeting shared memory can be emulated without the use of an atomic update primitive that strictly enforces atomicity.

BRIEF SUMMARY

According to at least one embodiment, a processing unit for a data processing system includes a processor core that issues memory access requests and a cache memory coupled to the processor core. The cache memory includes a reservation circuit that tracks reservations established by the processor core via load-reserve requests and a plurality of read-claim (RC) state machines for servicing memory access requests of the processor core. The cache memory, responsive to receipt from the processor core of a store-conditional request specifying a store target address, allocates an RC state machine among the plurality of RC state machines to process the store-conditional request and transfers responsibility for tracking a reservation for the store target address from the reservation circuit to the RC state machine.

BRIEF DESCRIPTION OF THE SEVERAL VIEWS OF THE DRAWINGS

FIG. 2A depicts a first exemplary instruction sequence that employs load-reserve and store-conditional instructions to synchronize access to shared memory;

FIG. 2B illustrates a second exemplary instruction sequence that employs load-reserve and store-conditional instructions to coordinate execution of a critical section of a multithreaded program;

FIG. 5B is a high-level logical flowchart of an exemplary method of processing a store-type request in the store queues of a processing unit in accordance with one embodiment;

FIG. 6B is a high-level logical flowchart of an exemplary method of processing a store request in a RC state machine of a lower level cache in accordance with one embodiment;

FIG. 7 is a high-level logical flowchart of an exemplary method of processing a snooped request in a lower level cache in accordance with one embodiment.

DETAILED DESCRIPTION

Figure 1A:
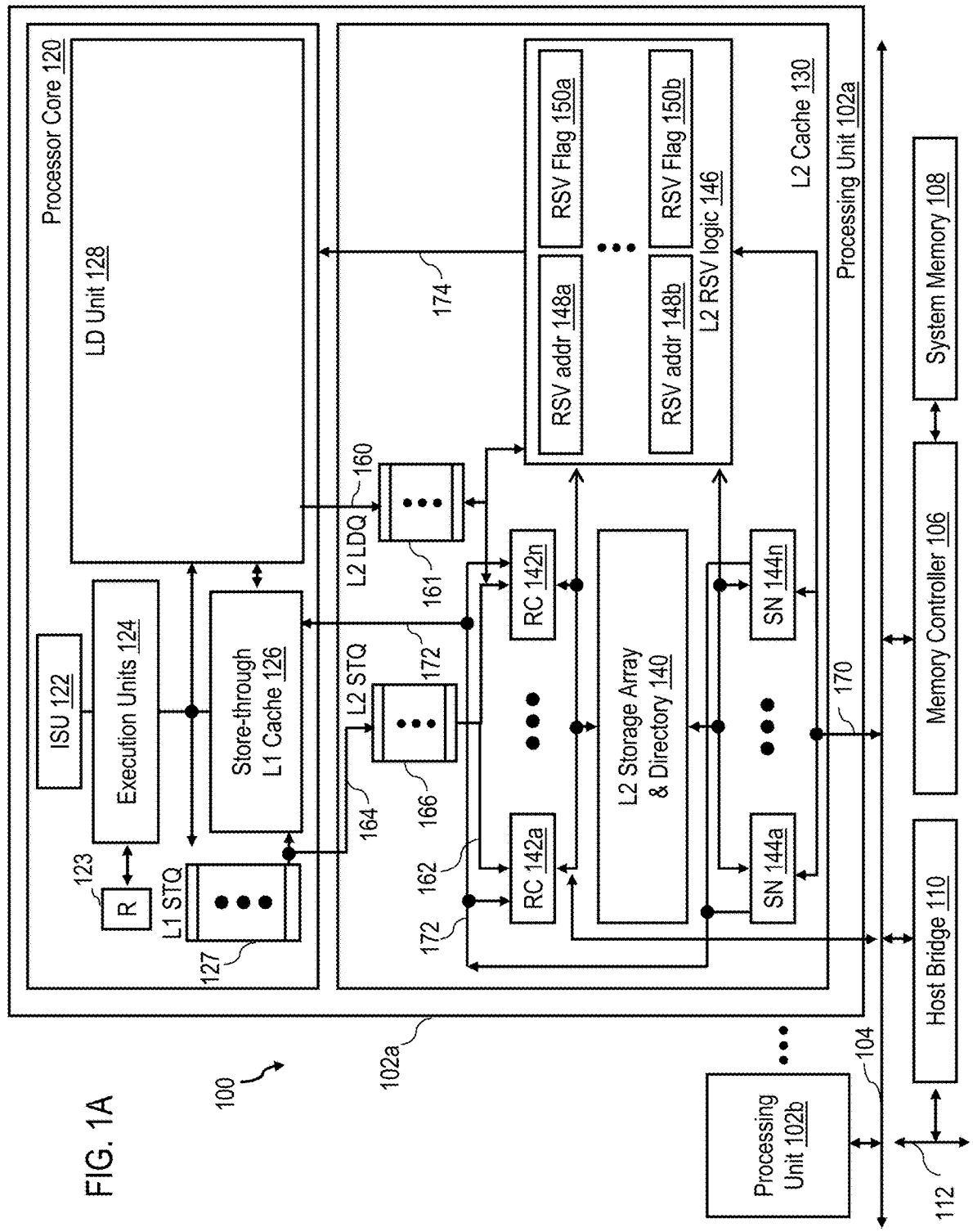
FIG. 1A is a high-level block diagram of an illustrative data processing system in accordance with one embodiment.

With reference now to the figures and in particular with reference to FIG. 1, there is illustrated a high-level block diagram of a data processing system 100 in accordance with one embodiment. As shown, data processing system 100 includes multiple processing units 102 (including at least processing units 102a-102b) for processing data and instructions. Processing units 102 are coupled for communication to a system interconnect 104 for conveying address, data and control information between attached devices. In the depicted embodiment, these attached devices include not only processing units 102, but also a memory controller 106 providing an interface to a shared system memory 108 and one or more host bridges 110, each providing an interface to a respective mezzanine bus 112. Mezzanine bus 112 in turn provides slots for the attachment of additional unillustrated devices, which may include network interface cards, I/O adapters, non-volatile memory, non-volatile storage device adapters, additional bus bridges, etc.

As further illustrated in FIG. 1, each processing unit 102, which may be realized as a single integrated circuit having a semiconductor substrate in which integrated circuitry is formed, includes one or more processor cores 120 (of which only one is explicitly shown) for processing instructions and data. Each processor core 120 includes an instruction sequencing unit (ISU) 122 for fetching and ordering instructions for execution, one or more execution units 124 for executing instructions dispatched from ISU 122, and a set of registers 123 for temporarily buffering data and control information. In a typical embodiment, registers 123 are implemented as a register pool from which processor core 120 can allocate registers to serve as either architected registers whose contents form part of the architected state of processor core 120 or rename registers whose contents may or may not eventually form part of the architected state of processor core 120. The instructions executed by execution units 124 include load-reserve and store-conditional instructions, which are utilized to synchronize access to shared memory between a particular thread of execution and other concurrent threads of execution, whether executing in the same processor core 120, a different processor core 120 in the same processing unit 102, or in a different processing unit 102. In a preferred embodiment, execution units 124 execute at least load-reserve and store-conditional instructions in-order (other instructions may or may not be executed out-of-order).

Each processor core 120 further includes an L1 store queue (STQ) 127 and a load unit 128 for managing the completion of store and load requests, respectively, corresponding to executed store-type and load-type instructions (including load-reserve and store-conditional instructions). In at least one embodiment, L1 STQ 127 may be implemented as a First-In, First-Out (FIFO) queue containing a plurality of queue entries. Store-type (or barrier) requests are accordingly loaded in the "top" entry of L1 STQ 127 at execution of the corresponding store-type (or barrier) instruction, and are initiated when the requests reach the "bottom" or "commit" entry of L1 STQ 127.

It is important to note that the present application makes a distinction between "instructions", such as load-reserve and store-conditional instructions, and "requests." Load and store "instructions" (including load-reserve and store-conditional instructions) are defined herein as inputs to an execution unit that include an request code (opcode) identifying the type of instruction and one or more operands specifying data to be accessed and/or its address. Load and store "requests," including load-reserve and store-conditional requests, are defined herein as data and/or signals generated following instruction execution that specify at least the target address of data to be accessed. Thus, load-reserve and store-conditional requests may be transmitted from a processor core 120 to the shared memory system to initiate data accesses, while load-reserve and store-conditional instructions are not.

The operation of processor core 120 is supported by a multi-level memory hierarchy having, at its lowest level, shared system memory 108, and at its upper levels two or more levels of cache memory, which in the illustrative embodiment include a level-one (L1) cache 126 and a level-two (L2) cache 130. As in other shared memory multiprocessor data processing systems, the contents of the memory hierarchy may generally be accessed and modified by threads of execution executing in any processor core 120 in any processing unit 102 of data processing system 100.

In accordance with one embodiment, L1 cache 126, which may include bifurcated L1 data and instruction caches, is implemented as a store-through cache, meaning that the point of cache coherency with respect to other processor cores 120 is located below L1 cache 126 and, in the depicted embodiment, is located at store-in L2 cache 130. Accordingly, as described above, L1 cache 126 does not maintain true cache coherency states (e.g., Modified, Exclusive, Shared, Invalid, etc.) for its cache lines, but only maintains valid/invalid bits. Because L1 cache 126 is implemented as a store-through cache, store requests first complete relative to the associated processor core 120 in L1 cache 126 and then complete relative to other processing units 102 at a point of system-wide coherency, which in the depicted embodiment is L2 cache 130.

Figure 1B:
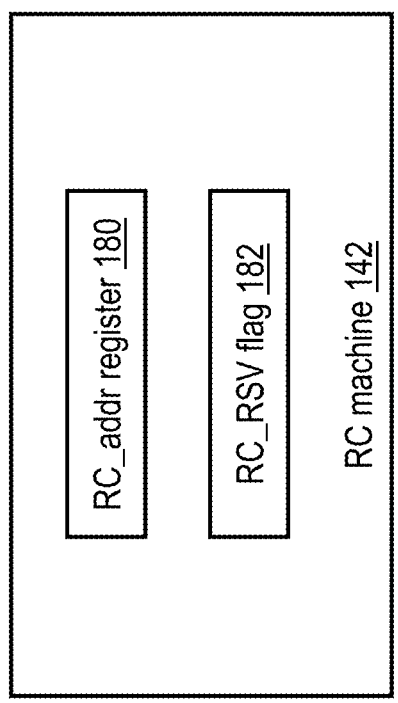
FIG. 1B is a more detailed view of a read-claim (RC) state machine within a lower level cache in accordance with one embodiment.

As further illustrated in FIG. 1, L2 cache 130 contains a storage array and directory 140 that store cache lines of instructions and data in association with their respective memory addresses and coherence states. L2 cache 130 also includes a number of read-claim state machines (RC machines) 142a-142n for independently and concurrently servicing memory access requests received from the associated processor cores 120. RC machines 142 receive core load-type requests from LD unit 128 in processor core 120 via load bus 160, an L2 load queue (LDQ) 161, and command bus 162. Similarly, RC machines 142 receive core store-type requests from L1 STQ 127 in processor core 120 via store bus 164, an L2 store queue (STQ) 166, and command bus 162. As depicted in FIG. 1B and discussed in greater detail below, each RC machine 142 preferably includes an RC address (RC_addr) register 180 and an associated RC reservation (RC_RSV) flag 182. When set (e.g., to 1'), RC_RSV flag 182 indicates that the RC machine 142 is responsible for managing a reservation for the address contained in the associated RC_addr register 180 (in lieu of L2 reservation logic 146 discussed below) and when reset (e.g., set to '0') indicates no such reservation exists.

L2 cache 130 further includes a number of snoop state machines (SN machines) 144a-144n for servicing memory access and other requests received from other processing units 102 via system interconnect 104 and snoop bus 170. SN machines 144 and RC machines 142 are each connected to a back-invalidation bus 172 by which any SN machine 144 or RC machine 142 can signal the invalidation of a cache line in L1 cache 126 to processor core 120.

It is important to note that in a preferred embodiment L2 cache 130 is constructed such that at most a single one of RC machines 142 and SN machines 144 can be active servicing a request targeting a given target cache line address at any one time. Consequently, if a second request is received while a first request targeting the same cache line is already being serviced by an active RC machine 142 or SN machine 144, the later-in-time second request must be queued or rejected until servicing of the first request is completed and the active state machine returns to an idle state.

L2 cache 130 finally includes L2 reservation logic 146 for recording reservations of the associated processor core 120. Specifically, in the illustrated embodiment, reservation logic 146 includes, for each hardware thread that may be concurrently executed by the associated processor core 120, a respective reservation register comprising a reservation address field 148 and a reservation flag 150. In the depicted example, which assumes that processor core 120 can each execute two concurrent hardware threads, reservation logic 146 includes two reservation registers: reservation address field 148a and reservation flag 150a for thread 0 and reservation address field 148b and reservation flag 150b for thread 1. When set (e.g., to '1'), a reservation flag 150 indicates that the corresponding hardware thread holds a reservation for the address contained in the associated reservation address field 148 and otherwise indicates no reservation is held. Reservation logic 146 supplies pass/fail indications indicating the success or failure of store-conditional (STCX) requests to processor cores 120 via pass/fail bus 174.

Those skilled in the art will additionally appreciate that data processing system 100 of FIG. 1 can include many additional non-illustrated components, such as interconnect bridges, non-volatile storage, ports for connection to networks or attached devices, etc. Because such additional components are not necessary for an understanding of the described embodiments, they are not illustrated in FIG. 1 or discussed further herein. It should also be understood, however, that the enhancements described herein are applicable to cache coherent data processing systems of diverse architectures and are in no way limited to the generalized data processing system architecture illustrated in FIG. 1.

Multiprocessor data processing systems such as data processing system 100 of FIG. 1 implement a memory consistency model that specifies the legal possible executions of a given multiprocessor program with respect to memory accesses (e.g., among other things, the values that may be returned by load instructions, the order of writes to memory, those instruction execution dependencies that affect the ordering of memory accesses, and the final values for memory locations at the conclusion of a multiprocessor program). A memory consistency model is specified by two major characteristics: ordering of memory access requests and atomicity of store requests.

The ordering of memory requests specifies how memory requests may, if at all, be re-ordered relative to the order of their respective load and store instructions in the individual threads of execution in the multiprocessor program. Memory consistency models must define ordering of memory access requests in four general cases: (1) ordering of the memory requests for a load instruction to a following load instruction, (2) ordering of the memory requests for a load instruction to a following store instruction, (3) ordering of the memory requests for a store instruction to a following store instruction, and (4) ordering of the memory requests for a store instruction to a following load instruction. Strong consistency memory models will, in general, preserve all or at least most of these orderings. In particular, many strong consistency memory models enforce the first three orderings, but do not enforce store-to-load ordering. Weak consistency memory models will generally not enforce most or all of these orderings.

Atomicity of store requests refers to whether or not a given thread of execution can read the value of its own store request before other threads, and furthermore, whether the value written to the distributed shared memory system by the store request becomes visible to other threads in a logically instantaneous fashion or whether the value can become visible to other threads at different points in time. A memory consistency model is called "multi-copy atomic" if the value written by a store request of one thread becomes visible to all other threads in a logically instantaneous fashion. In general, strong consistency memory models are multi-copy atomic, and weak consistency memory models do not enforce multi-copy atomicity.

In a given multiprocessor program, program semantics often require that multi-copy atomicity and/or the various orderings between memory access requests are respected. Therefore, in an exemplary embodiment of data processing system 100, in which the distributed shared memory system implements a weak consistency memory model, so called "barrier" (e.g., SYNC) instructions are typically provided to allow the programmer to specify what memory access request orderings and atomicity are to be applied during execution of the multiprocessor program. In particular, a barrier instruction causes the distributed shared memory system to perform any memory accesses initiated by instructions preceding the barrier instruction prior to any memory accesses initiated by instructions following the barrier instruction.

Referring now to FIG. 2A, there is depicted a first exemplary instruction sequence 200 that employs load-reserve and store-conditional instructions to synchronize access to shared memory. In particular, instruction sequence 200 is utilized to update the value of a variable in shared memory.

Instruction sequence 200 begins with a LARX instruction 202 that loads the value of the variable (i.e., var) from shared memory into a private register r1 in the processor core executing the instruction and establishes a reservation for the target address of the variable for the executing hardware thread. The value of the variable is then updated locally in register r1, in this case, by an ADD instruction 204 incrementing the value of the variable by 1. The new value of the variable is then conditionally stored back into shared memory by STCX instruction 206, based, among other things, on whether or not the executing hardware thread still holds a reservation for the target address of the variable. The success or failure of STCX instruction 206 in updating the value of the variable in shared memory is reflected in a condition code register (e.g., one of registers 123) in the processor core. Conditional branch instruction 208 then tests the condition code found in the condition code register and conditionally redirects execution based on the success or failure of STCX instruction 206. If the relevant bit(s) of the condition code register is/are equal to zero, indicating that the conditional update to the variable indicated by STCX instruction 206 failed (e.g., due to an intervening storage-modifying access to the variable by another thread between execution of LARX instruction 202 and STCX instruction 208), instruction sequence 200 will be repeated, and execution branches from conditional branch instruction 208 back to LARX instruction 202. If, however, the conditional update indicated by STCX instruction 206 succeeds, the condition code will be non-zero, and processing will continue with the next sequential instruction following instruction sequence 200.

With reference now to FIG. 2B, there is illustrated a second exemplary instruction sequence 210 that employs load-reserve and store-conditional instructions to coordinate execution of a critical section of a multithreaded program. As indicated, instruction sequence 210 includes, in program order, a lock acquisition sequence 214, critical section 216, and lock release sequence 218.

As is known in the art, critical section 216 is, by definition, a portion of a program that includes accesses to a shared resource (e.g., a shared in-memory data set) that must not be concurrently accessed by more than one hardware thread of the multiprocessor program. In order to keep the various hardware threads from making concurrent accesses to the shared resource, the multithreaded program bounds critical section 206 with barrier instructions 240, 244 that order execution of instructions within critical section 216 with respect to both instructions in the same hardware thread that are outside critical section 216. In addition, the multiprocessor program ensures that not more than one hardware thread at a time enters into a critical section by implementing a lock to which access is synchronized by load-reserve and store-conditional instructions.

In particular, a hardware thread attempts to acquire the lock needed to enter critical section 216 through execution of lock acquisition sequence 214. Lock acquisition sequence 214 begins with a LARX instruction 230 that loads the value of the lock variable (i.e., lock) from shared memory into a private register r1 (e.g., one of registers 123) in the executing processor core. The value of the lock variable is then tested by compare instruction 232 to determine whether or not the lock is currently in a locked state (i.e., the lock is held by another hardware thread). If so, conditional branch instruction 234 causes execution to return to the beginning of polling instruction sequence 212 (which is described in greater detail below). If a determination that the lock is not currently held by another thread, a LOAD immediate instruction 236 places a value of "1" representing a locked state into a register r2. A STCX instruction 238 then conditionally updates the lock variable in shared memory to the locked state, thus securing the lock for the executing thread. As before, the success or failure of the STCX instruction in updating the value of the lock variable in shared memory is reflected in a condition code register in the processor core.

Conditional branch instruction 239 tests the condition code found in the condition code register and conditionally redirects execution based on the success or failure of STCX instruction 238. If the relevant bit(s) of the condition code register is/are equal to zero, indicating that the conditional update to the lock variable indicated by STCX instruction 238 failed (e.g., due to an intervening storage-modifying access to the lock variable by another thread between execution of LARX instruction 230 and STCX instruction 238), lock acquisition sequence 214 will be repeated from LARX instruction 230. If, however, the conditional update to the lock variable indicated by STCX instruction 238 succeeds, the condition code will be non-zero, and processing will proceed sequentially to critical section 216. Once critical section 216 completes, the thread will release the lock by updating the lock variable in shared memory by executing a lock release sequence 218 including a LOAD immediate instruction 250 that loads register r2 with a value of "0" representing an unlocked state and a STORE instruction 252 that updates the lock variable in shared memory with this value. Thereafter, execution of the thread proceeds to subsequent instructions, if any.

As a hardware thread of a processor core 120 executes instruction sequence 210 to enter critical section 216, one or more other hardware threads executing on the same processor core 120 (i.e., local or co-located hardware threads) or on other processor cores 120 (i.e., remote threads) may also be concurrently attempting to acquire and update the lock variable utilizing a similar or identical lock acquisition sequence 214. Because of this contention, a given hardware thread may have to repetitively execute lock acquisition sequence 214, as the competing accesses of other hardware threads cancel the reservation of the given hardware thread for the memory location containing the lock variable. As a result, the resources of the processing unit executing the given hardware thread will not be efficiently utilized.

For example, LARX instruction 230, which is utilized to load the lock value and set the reservation for the lock address upon which the execution of STCX instruction 238 depends, is generally a resource-intensive instruction. Irrespective of the chosen implementation of the cache hierarchy, a LARX instruction such as LARX instruction 230 requires communication with the coherence point of the cache hierarchy. For example, in the current embodiment, regardless of whether the target address of LARX instruction 230 hits or misses in L1 cache 126, execution of LARX instruction 230 would require allocation of an entry in L2 LDQ 161, dispatch of an RC machine 142 in L2 cache 130, and update of reservation logic 146. STCX instruction 230 similarly requires communication with the coherence point of the cache hierarchy and consumes a similar set of resources.

The present disclosure appreciates that it is desirable to accelerate the processing of instruction sequences, such as those depicted in FIGS. 2A-2B, which synchronize access to shared memory via LARX and STCX instruction pairs. In particular, the present disclosure recognizes that a significant contribution to the overall latency of a LARX request in an instruction sequence containing multiple LARX/STCX pairs is the latency incurred by the LARX request waiting for return from the coherence point of the cache hierarchy of a pass/fail indication for a previous STCX request of the same hardware thread. As discussed below, the latency of a subsequent LARX request can be significantly reduced by transferring responsibility for monitoring a reservation for the hardware thread from a centralized reservation facility (e.g., L2 reservation logic 146) prior to completion of the previous STCX request, thus freeing the centralized reservation facility to establish a new reservation requested by the subsequent LARX request.

Figure 3A:
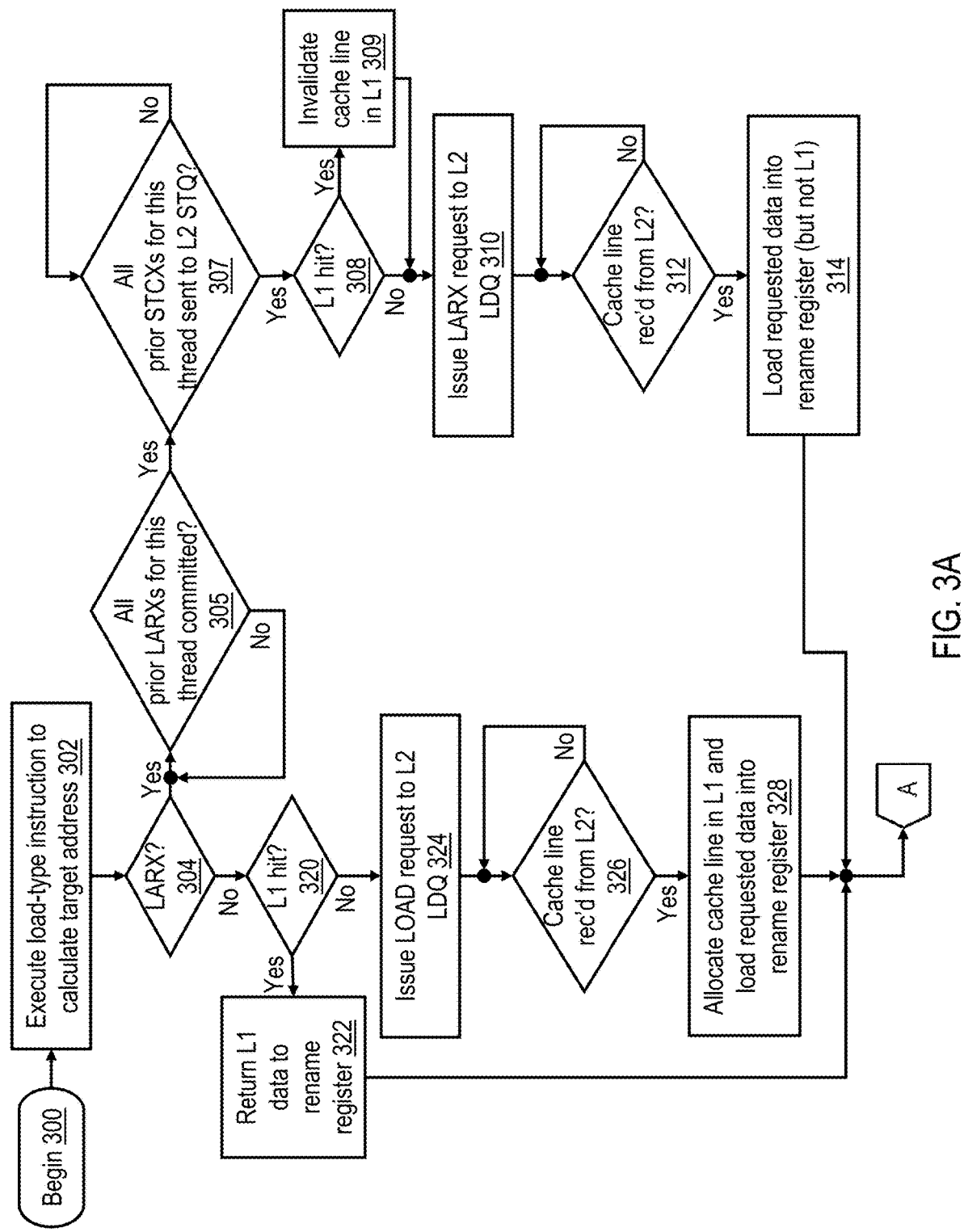
FIGS. 3A-3B together form a high-level logical flowchart of an exemplary method of processing a load-type instruction in a processor core in accordance with one embodiment.

With reference now to FIG. 3A, there is depicted a high-level logical flowchart of an exemplary method by which a processor core 120 of data processing system 100 processes a load-type instruction (e.g., a LOAD or LARX instruction) in accordance with one embodiment. As shown, the process begins at block 300 and thereafter proceeds to block 302, which illustrates execution units 124 receiving a load-type instruction, such as a LOAD or LARX instruction, of a given hardware thread from ISU 122 and then executing the load-type instruction to calculate the load target address.

Following execution of the load-type instruction, an indication of the given hardware thread executing the load-type instruction, instruction type, and the load target address are received from execution units 124 by LD unit 128. As illustrated at block 304, if the indication of the instruction type indicates the load-type instruction executed at block 302 was not a LARX instruction, LD unit 128 performs the processing illustrated at block 320 and following blocks, which are described below. If, however, the load-type instruction executed at block 302 was a LARX instruction, LD unit 128 performs the processing depicted at block 305 and following blocks.

Block 305 depicts LD unit 128 waiting to process the LARX request received at block 304 until all prior LARX requests of the given hardware thread issued by LD unit 128 have committed (e.g., returned their load data to registers 123). Thus, in a preferred embodiment, processor core 120 processes the LARX requests within each of its hardware threads in-order and without pipelining, meaning that the data words(s) requested by a LARX request must be loaded to one or more registers 123 in processor core 120 at least before issuing a subsequent LARX request to L2 cache 130. This restriction simplifies the management of reservations by L2 cache 130.

Block 307 additionally illustrates that LD unit 128 waits to process the LARX request received at block 304 until all prior STCX requests of the same given hardware thread have been issued from L1 STQ 127 to L2 STQ 166. Importantly, progress of the LARX request is not delayed by awaiting a pass/fail indication via pass/fail bus 174 for a prior STCX request, if any, but only issuance of such a STCX request from L1 STQ 127. Thus, in the embodiments described herein, a LARX request following a prior STCX request of the same hardware thread can be issued to LD unit 128 and L2 LDQ 161 earlier than in prior art system by at least the period of time that the prior STCX request is processed in L2 cache 130. Those skilled in the art will recognize that, though not directly illustrated here, in some embodiments, processor core 120 can process a LARX request before all prior STCX requests are issued to L2 STQ 166 if program ordering is maintained between any STCX request and subsequent LARX request(s) to the same address. In response to satisfaction of the conditions depicted at blocks 305-307, the process of FIG. 3A proceeds to block 308.

At block 308, LD unit 128 determines whether or not the load target address of the LARX request hits in the directory of L1 cache 126. If so, LD unit 128 invalidates the cache line containing the load target address in L1 cache 126 by updating the directory of L1 cache 126 (block 309). Those skilled in the art should appreciate that the invalidation of the cache line containing the load target address in L1 cache 126 is a simplifying design choice and that in other embodiments the cache line containing the load target address need not be invalidated in L1 cache 126. Following block 309 or in response to determining at block 308 that the load target address of the LARX instruction missed in the directory of L1 cache 126, LD unit 128 issues a LARX request to L2 LDQ 161 of L2 cache 130 via load bus 160 (block 310). The LARX request includes, for example, an indication of the request type (i.e., LARX), the load target address, and an identifier of the issuing hardware thread. After buffering the LARX request in L2 LDQ 161, L2 cache 130 dispatches the LARX request to an RC machine 142 for servicing, as described further below with reference to FIGS. 4A-4B.

Next, at block 312, LD unit 128 awaits return of the requested cache line identified by the load target address of the LARX request from L2 cache 130. In response to receipt of the requested cache line, LD unit 128 transfers the data word(s) associated with the load target address into a rename register among registers 123, but does not cache the requested cache line in L1 cache 126 (block 314). It should be appreciated that in alternative embodiments that do not invalidate the requested cache line at block 309, the requested cache line can instead be cached in L1 cache 126 to permit subsequent loads (including subsequent LARX requests), to hit in L1 cache 126. Following block 314, the process of FIG. 3A passes through page connector A to FIG. 3B, which is described below.

If LD unit 128 determines at block 304 that the load-type request is not a LARX request, but is instead a LOAD request, LD unit 128 also determines whether or not the load target address of the LOAD request hits in the directory of L1 cache 126 (block 320). If so, LD unit 128 simply places a copy of the requested data word(s) obtained from L1 cache 126 into a rename register among registers 123 (block 322). If, however, the load target address of the LOAD request misses in the directory of L1 cache 126, LD unit 128 issues a LOAD request to the L2 LDQ 161 of the associated L2 cache 130 via load bus 160 (block 324). The LOAD request may include, for example, an indication of the request type (e.g., LOAD), the load target address, and an identifier of the issuing thread. After buffering the LOAD request in L2 LDQ 161, L2 cache 130 dispatches the LOAD request to an RC machine 142 for servicing, as described further below with reference to FIGS. 4A-4B.

Next, at block 326, LD unit 128 waits until the requested cache line identified by the load target address of the LOAD request is returned by L2 cache 130. In response to receipt of the requested cache line, LD unit 128 transfers the data word(s) associated with the load target address into a rename register among registers 123 and allocates the requested cache line in L1 cache 126 (block 328). Following block 322 or block 328, the process of FIG. 3A passes through page connector A to FIG. 3B.

Figure 3B:
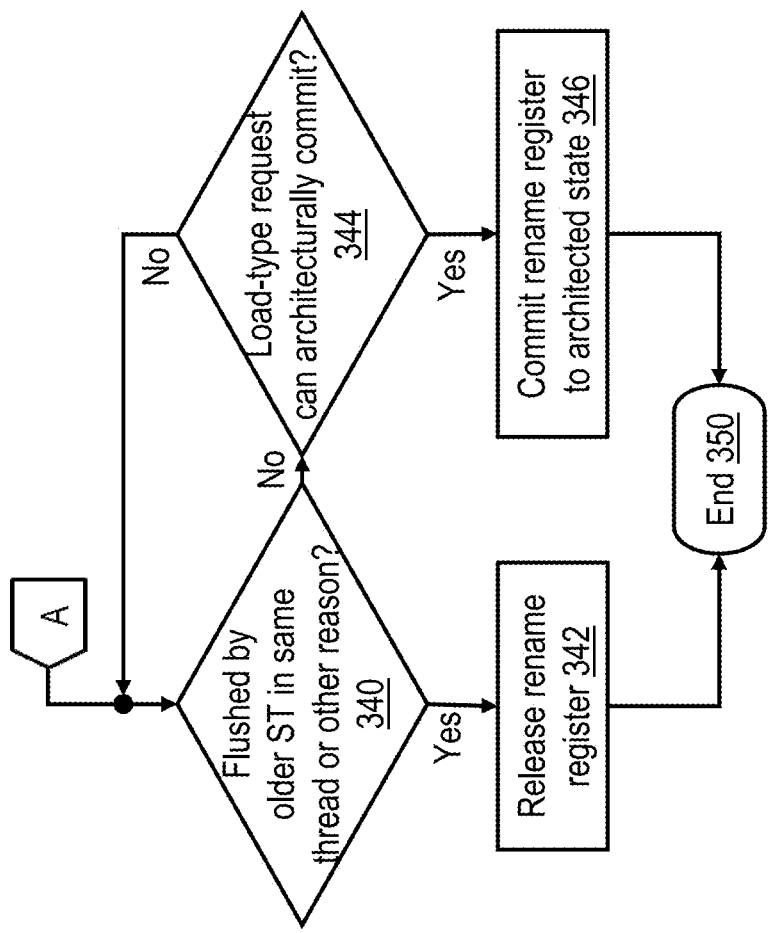

FIG. 3B depicts the conditional commitment of data returned by a load-type request to the architected state of processor core 120. The process of FIG. 3B begins at page connector A and then proceeds to block 340, which illustrates processor core 120 determining whether or not load data buffered in a rename register among registers 123 is to be flushed, for example, by an older store-type request that targets an address that overlaps with the load target address of the load-type request that returned the data to the rename register. As indicated in block 340, such a store-hit-load collision is but one of many possible reasons for load data buffered in a rename register to be flushed. In response to an affirmative determination at block 340, processor core 120 releases the rename register buffering the load data, thus discarding the data buffered therein (block 342). Thereafter, the process of FIG. 3B ends at block 350.

Returning to block 340, if a negative determination is made at block 340, processor core 120 additionally determines at block 344 whether or not the load-type request associated with data buffered in a rename register among registers 123 is architecturally able to be committed. If not, the process of FIG. 3B returns to block 340, which has been described. If, however, processor core 120 determines at block 344 that the load-type request associated with data buffered in a rename register is architecturally able to be committed, processor core 120 commits the rename register to the architected state of processor core 120, for example, by updating a pointer or other data structure to identify the rename register as one of the architected registers of processor core 120 (block 346). Following block 346, the process of FIG. 3B ends at block 350.

Figure 4A:
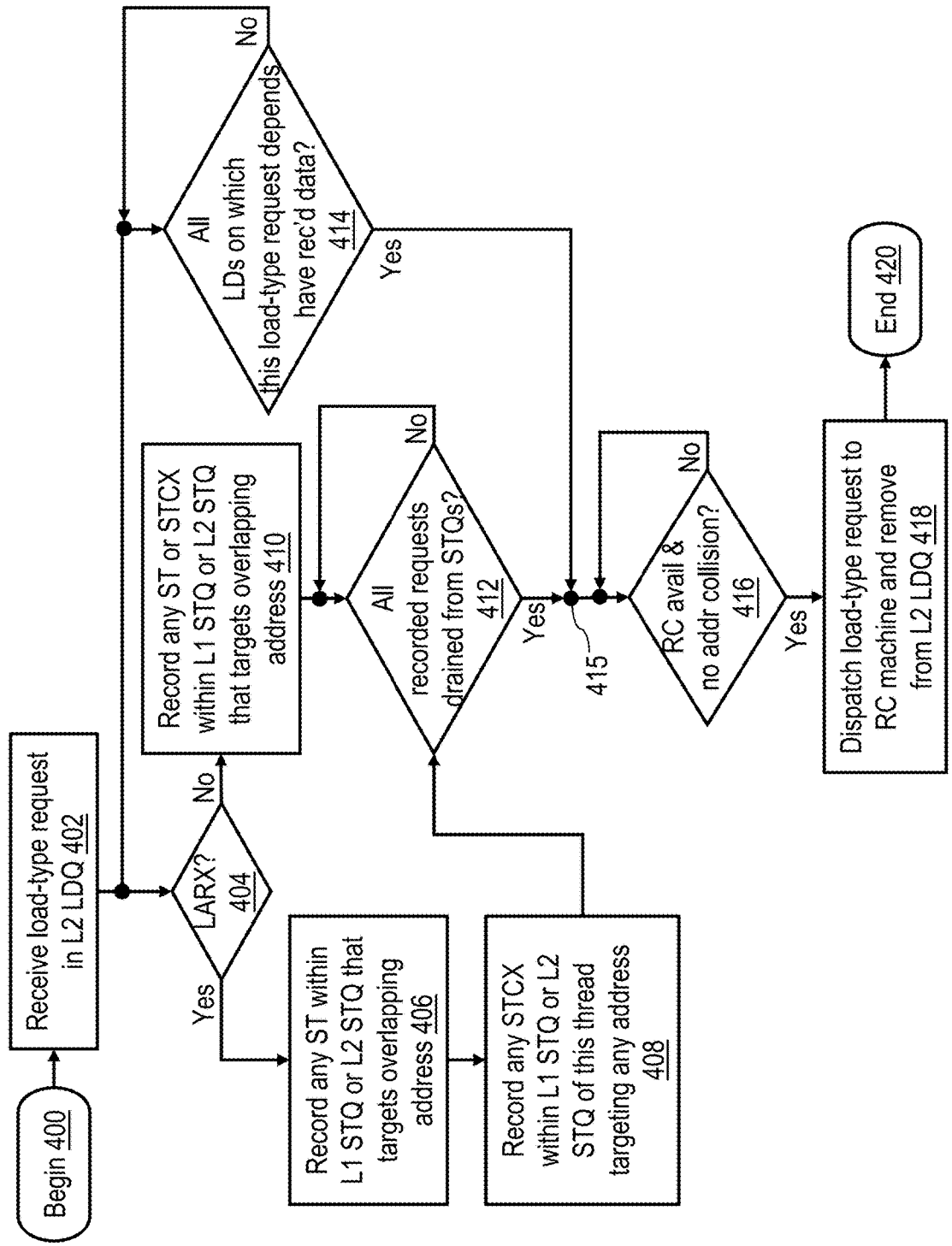
FIG. 4A is a high-level logical flowchart of an exemplary method of processing a load-type request in a load queue of a lower level cache in accordance with one embodiment.

Referring now to FIG. 4A, there is depicted a high-level logical flowchart of an exemplary method by which an L2 LDQ 161 of an L2 cache 130 of data processing system 100 processes a load-type request in accordance with one embodiment. The process begins at block 400 and then proceeds to block 402, which depicts L2 LDQ 161 of L2 cache 130 receiving a load-type request from the LD unit 128 of the associated processor core 120 via load bus 160. Following block 402, the process of FIG. 4A bifurcates and proceeds in parallel to block 404 and following blocks, which depict L2 LDQ 161 resolving any store dependencies of the load-type request, and to block 414, which depicts L2 LDQ 161 resolving any load dependencies of the load-type request.

Block 404 illustrates L2 LDQ 161 determining whether or not the load-type request received at block 402 is a LARX request. If so, L2 LDQ 161 builds a store dependency record for the load-type request by recording any store request within L1 STQ 127 or L2 STQ 166 having a store target address that overlaps the load target address of the LARX request (block 406) and by recording any STCX request of the same hardware thread within L1 STQ 127 or L2 STQ 166 that targets any address (block 408). The process then proceeds to block 412, which is described below.

Returning to block 404, in response to L2 LDQ 161 determining that the load-type request is not a LARX request, L2 LDQ 161 builds a store dependency record for the load-type request by recording any store or STCX request within L1 STQ 127 or L2 STQ 166 having a store target address that overlaps the load target address of the load-type request. The process then passes to block 412, which illustrates L2 LDQ 161 waiting to process the load-type request received at block 402 until all associated store dependencies have cleared, that is, the store and/or STCX requests, if any, recorded at either blocks 406-408 or block 410 have drained from both L1 STQ 127 and L2 STQ 166. Once all of these store dependencies have cleared, the process proceeds from block 412 to join point 415, at which the process waits until all load dependencies noted at block 414 have similarly cleared. As shown at block 414, L2 LDQ 161 determines at block 414 that all load dependencies for a load-type request have cleared if all older load requests, if any, on which the load-type request depends (i.e., those having the same load target address) have received their data.

Following a determination that all store dependencies and load dependencies for the load-type request have cleared, the process then proceeds from join point 415 to block 416, which illustrates L2 LDQ 161 determining whether or not an RC machine 142 is available to process the load-type request and whether or not the load target address of the load-type request conflicts with the request address of any other request currently being processed by an active RC machine 142 or active SN machine 144. If no RC machine 142 is available to process the load-type request or if the load target address of the load-type request conflicts with the request address of any request currently being processed by one of state machines 142-144, the process of FIG. 4A iterates at block 416. If, however, L2 LDQ 161 determines at block 416 that an RC machine 142 is available to process the load-type request and the load target address of the load-type request does not conflict with the request address of any request currently being processed by one of state machines 142-144, L2 LDQ 161 dispatches the load-type request to an available RC machine 142 for processing and removes the load-type request from L2 LDQ 161 (block 418). The process of FIG. 4A then terminates at block 420.

Figure 4B:
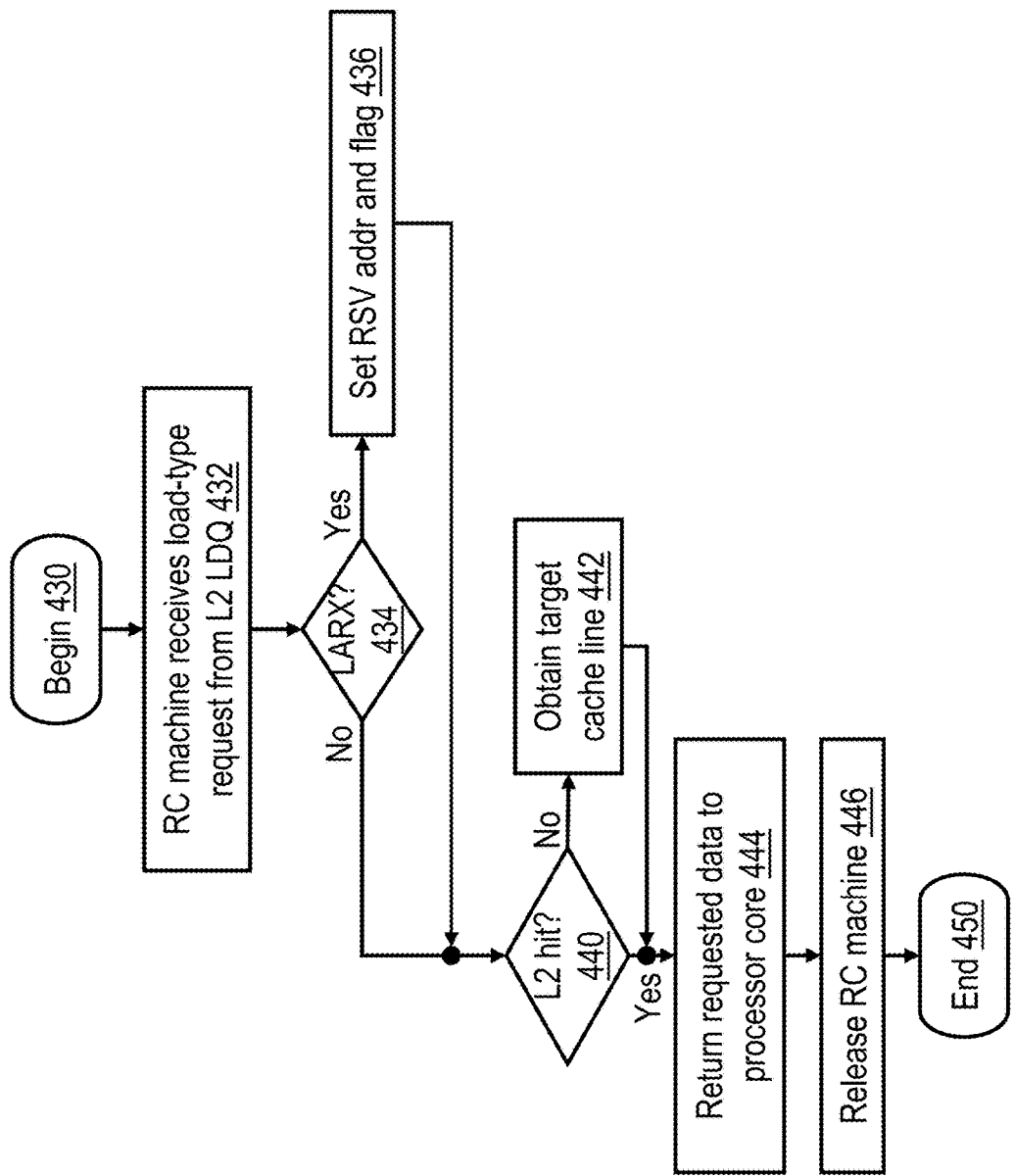
FIG. 4B is a high-level logical flowchart of an exemplary method of processing a load-type request in an RC state machine of a lower level cache in accordance with one embodiment.

With reference now to FIG. 4B, there is illustrated a high-level logical flowchart of the processing of the load-type request by an RC machine 142 in accordance with one embodiment. The process of FIG. 4B begins at block 430 and then proceeds to block 432, which illustrates an RC machine 142 receiving a load-type request of the associated processor core 120 issued from L2 LDQ 161, as described above with reference to block 418 of FIG. 4A. Next, at block 434, the dispatched RC machine 142 determines whether or not the load-type request is a LARX request or a LOAD request. If the load-type request is a LOAD request, the process passes to block 440 and following blocks, which are described below. If, however, RC machine 142 determines at block 434 that the load-type request is a LARX request, the process proceeds to block 436.

As illustrated at block 436, RC machine 142 establishes a reservation for the load target address of the LARX request in L2 cache 130 in the reservation register of the appropriate hardware thread by placing the load target address in the appropriate reservation address field 148 and setting the associated reservation flag 150. At block 440, the dispatched RC machine 142 determines whether or not the load target address of the LOAD or LARX request hits in L2 storage array and directory 140. If so, the process passes directly to block 444. If not, RC machine 142 issues one or more requests on system interconnect 104 in order to obtain a copy of the requested cache line from another cache hierarchy or system memory 108 (block 442). Following block 442, the process proceeds to block 444, which depicts RC machine 142 returning the requested cache line to the associated processor core 120 via an unillustrated data path. The return of the requested cache line to the associated processor core 120 at block 444 ends all operations of RC machine 142 required to service the LOAD or LARX request. Accordingly, the RC machine 142 is released to return to an idle state at block 446. The process of FIG. 4B thereafter terminates at block 450.

Figure 5A:
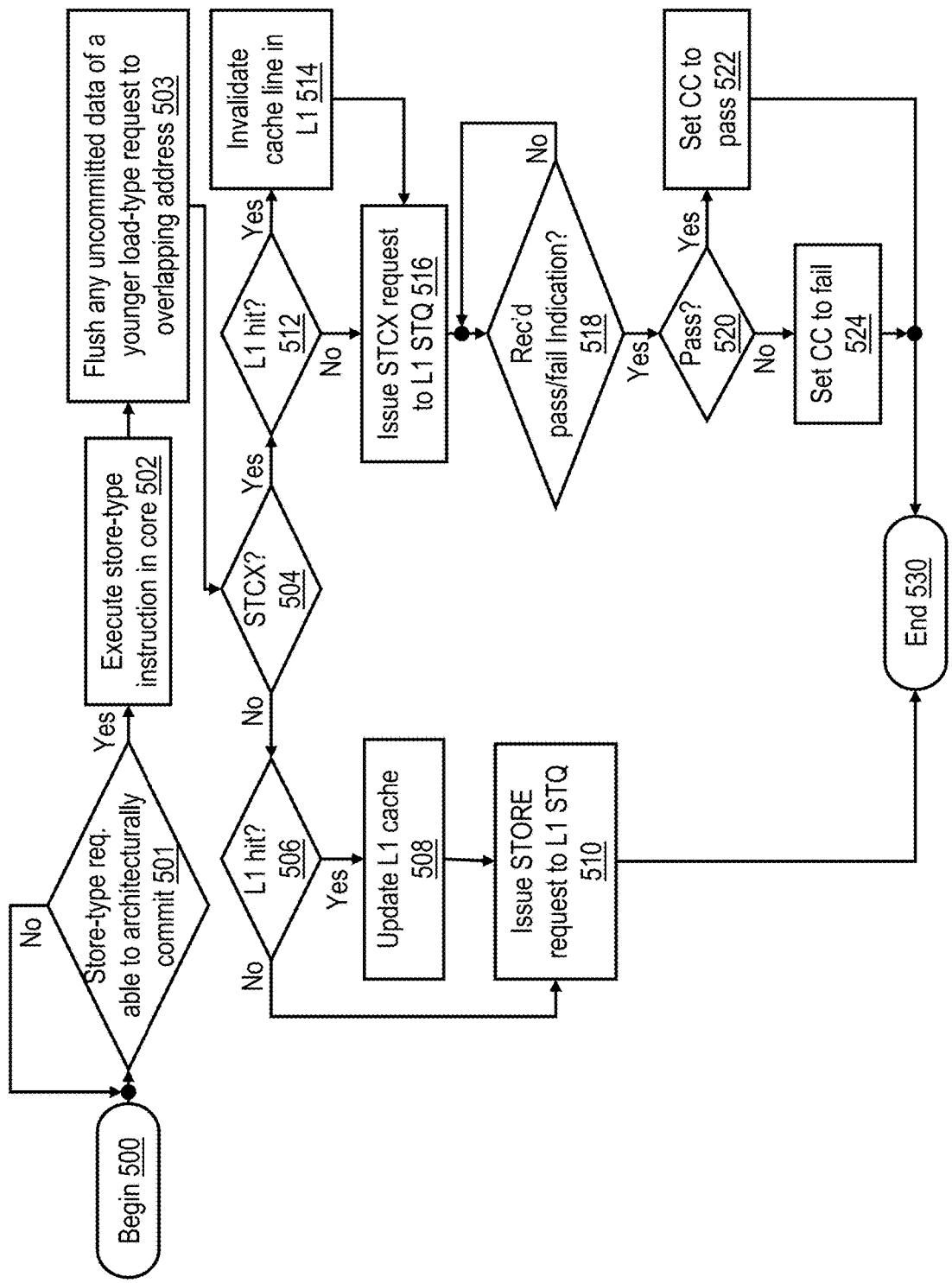
FIG. 5A is a high-level logical flowchart of an exemplary method of processing a store-type instruction in a processor core in accordance with one embodiment.

With reference now to FIG. 5A, there is illustrated a high-level logical flowchart of an exemplary method of processing a store-type instruction in a processor core 120 in accordance with one embodiment. As depicted, the process begins at block 500 and thereafter proceeds to block 501, which illustrates a processor core 120 deferring execution of a next store-type instruction until a corresponding store-type request, such as a STORE or STCX request, is able to architecturally commit. Execution units 124 thus preferably execute STCX instructions within the same hardware thread in-order with respect to both LARX and STCX instructions. In response to a determination at block 501 that a store request of a next store-type instruction is able to architecturally commit, the process passes to block 502, which illustrates execution units 124 receiving a store-type instruction, such as a STORE or STCX instruction, from ISU 122 and then executing the store-type instruction to calculate the store target address. Processor core 120 additionally flushes any uncommitted data associated with a younger load-type request having an overlapping target address, if any, as discussed above with reference to block 340-342 of FIG. 3B (block 503).

As indicated by block 504, following execution of the store-type instruction, processor core 120 handles STCX requests as illustrated at block 512 and following blocks and STORE requests as illustrated at block 506 and following blocks. Referring first to block 506, processor core 120 determines if the store target address of the STORE request hits in the directory of L1 cache 126. If so, processor core 120 updates the target cache line held in L1 cache 126 with the store data referenced by the STORE request (block 508). Following block 508 or in response to the store target address missing in the directory of L1 cache 126 at block 506, processor core 120 installs the STORE request into L1 STQ 127. The STORE request can include at least the store target address calculated by execution of the STORE instruction, a thread identifier, and store data. Following block 510, the process of FIG. 5A ends at block 530.

Referring now to block 512, processor core 120 determines if the store target address of the STCX request hits in the directory of L1 cache 126. If so, L1 STQ 127 invalidates the target cache line held in L1 cache 126 by updating the L1 directory (block 514). Following block 514 or in response to the store target address missing in the directory of L1 cache 126 at block 512, processor core 120 installs the STCX request into L1 STQ 127 (block 516). Processor core 120 then awaits return via pass/fail bus 174 of a pass/fail indication for the STCX request indicating whether or not the STCX request succeeded in updating L2 cache 130 (block 518). In response to receipt of the pass/fail indication via pass/fail bus 174, processor core 120 provides the pass/fail indication to execution units 124 (e.g., to indicate whether the path of execution should change) and, as shown at blocks 520-524, updates a condition code register 123 to indicate whether the STCX request passed or failed. Thereafter, the process of FIG. 5A terminates at block 530.

With reference now to FIG. 5B, there is illustrated a high-level logical flowchart of an exemplary method of processing a store-type request within the store queues of a processor core and lower level cache in accordance with one embodiment. The process of FIG. 5B begins at block 550 and then proceeds in parallel to blocks 552-554, which illustrate two conditions for issuing a store-type request installed in L1 STQ 127 at block 510 or block 516 of FIG. 5A to L2 STQ 166. In particular, in the depicted embodiment, L1 STQ 127 is enabled to issue a store-type request to L2 STQ 166 if the store-type request has no dependency to any older operation (e.g., barrier operation or store-type request) in L1 STQ 127 (block 552) and if the L2 STQ 166 has an available entry for the store-type request (block 554). If both the conditions illustrated at blocks 552-554 are satisfied, L1 STQ 127 issues the store-type request to L2 STQ 166 and removes the store-type request from L1 STQ 127 (block 556).

Following block 556, the process proceeds in parallel to blocks 560-562, which illustrate two conditions for issuing the store-type request installed in L2 STQ 166 at block 556 to an RC machine 142 for processing. In particular, in the depicted embodiment, L2 STQ 166 is enabled to issue a store-type request (e.g., for processing by an RC machine 142) if the store-type request has no dependency to any older operation (e.g., barrier operation or store-type request) in L2

STQ 166 (block 560) and if an RC machine 142 is available to process the store-type request and the store target address of the store-type request does not collide with any request address currently being processed by one of RC machines 142 or SN machines 144 (block 562). If both the conditions illustrated at blocks 560-562 are satisfied, L2 STQ 166 issues the store-type request and removes the store-type request from L2 STQ 166 (block 564). Following block 564, the process of FIG. 5B ends at block 566.

Figure 6A:
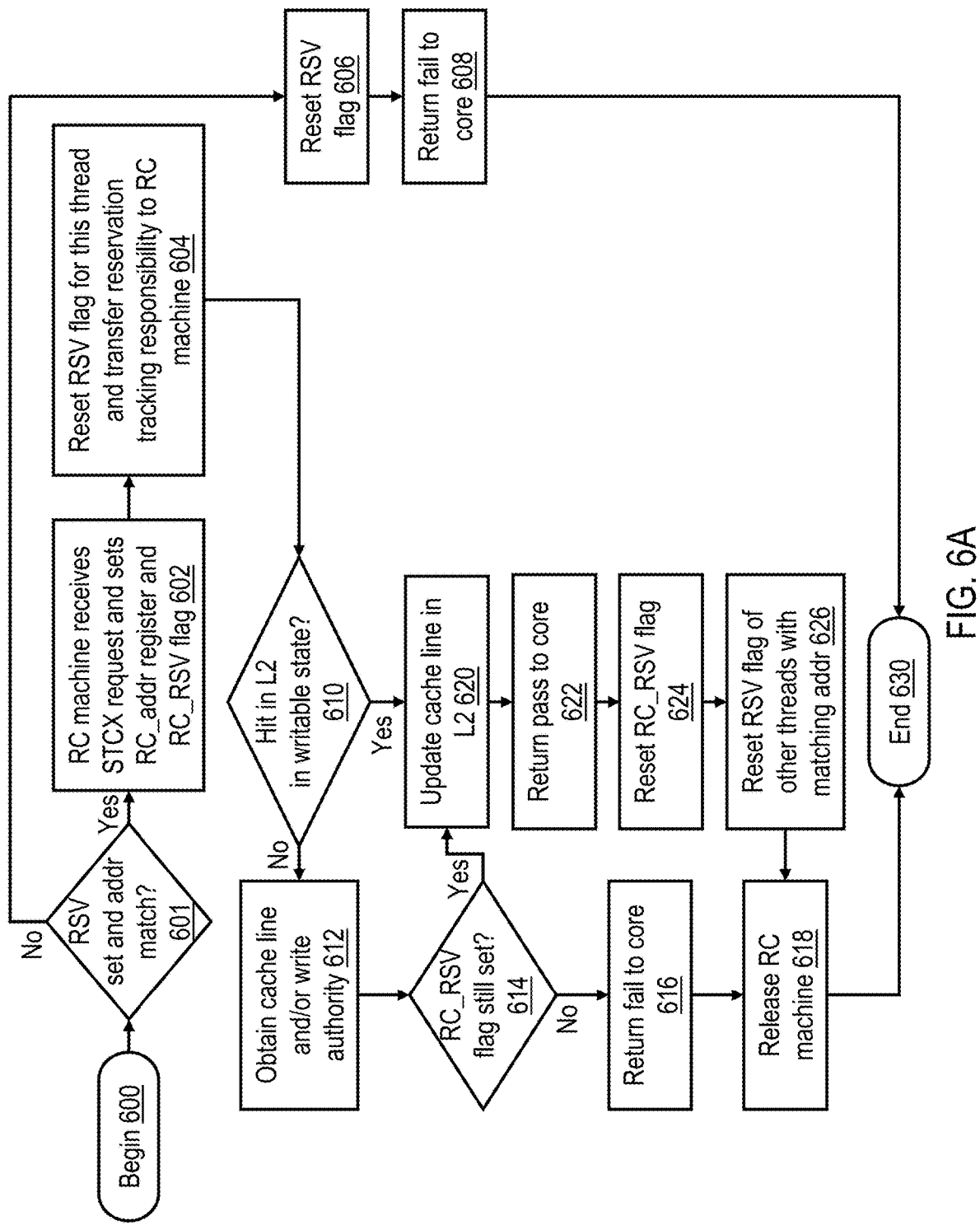
FIG. 6A is a high-level logical flowchart of an exemplary method of processing a store-conditional request in a RC state machine of a lower level cache in accordance with one embodiment.

Referring now to FIG. 6A, there is depicted a high-level logical flowchart of an exemplary method of processing a STCX request in an RC state machine of a lower level cache (e.g., L2 cache 130) in accordance with one embodiment. The process begins at block 600 and then proceeds to block 601, which illustrates L2 cache 130 determining whether the hardware thread of a STCX request issued from L2 STQ 166 (e.g., at block 564 of FIG. 5B) has a valid reservation for the store target address of the STCX request based on whether the relevant thread's RSV flag 150 is set and the associated RSV register 148 specifies a reservation address matching the STCX request target address. If not, L2 cache 130 resets the RSV flag 150 of the relevant hardware thread and discards the STCX request (block 606). In addition, L2 reservation logic 146 returns a fail indication to processor core 120 via pass/fail bus 174 to report that the STCX request made no update to L2 cache 130 (block 608). Thereafter, the process of FIG. 6A ends at block 630.

Returning to block 601, in response to L2 cache 130 determining that the issuing hardware thread has a valid reservation for the store target address of the STCX request, L2 cache 130 dispatches an available RC machine 142 to process the STCX request. As indicated at block 602, the RC machine 142 receives the STCX request and places the request address of the STCX request in its RC_addr register 180 and sets RC_RSV flag 182. In addition, RC machine 142 resets the RSV flag 150 of the relevant hardware thread (block 604), thus transferring responsibility for tracking the reservation of that hardware thread to the RC machine 142 and enabling a subsequent LARX request of the same hardware thread to establish a new reservation prior to resolution of the STCX request as passing or failing.

At block 610, RC machine 142 determines whether or not the store target address of the STCX request hits in L2 storage array and directory 140 in a "writeable" coherence state that confers authority on L2 cache 130 to modify the target cache line (block 610). If so, the STCX request will succeed in the conditional update of shared memory, and the process passes to block 620, which is described below. If not, RC machine 142 obtains authority to modify the target cache line and, if necessary, a copy of the target cache line from another cache hierarchy or memory controller 106 by issuing one or more requests on system interconnect 104 (block 612). At block 614, the RC machine 142 again checks whether or not the issuing hardware thread has a valid reservation for the store target address of the STCX request based on the state of its RC_RSV flag 182, as the reservation may have been reset due to an intervening store access of another hardware thread while a copy of the target cache line in a writeable coherence state was being obtained at block 612. In response to a determination that the reservation of the thread for the store target address of the STCX request is still set, the process passes to block 620, which is described below. However, in response to a determination at block 614 that the reservation is not still set (i.e., RC_RSV flag 182 has been reset by a store access of another hardware thread), RC machine 142 returns a fail indication to processor core 120 via pass/fail bus 174 to report that the STCX request failed to update L2 cache 130 (block 616). The process thereafter passes to block 618, which is described below.

Block 620 illustrates RC machine 142 updating the target cache line in L2 storage array and directory 140 with the store data of the STCX request. RC machine 142 additionally returns a pass indication to processor core 120 via pass/fail bus 174 to report successful update of the L2 cache 130 (block 622). RC machine 142 also resets its RC_RSV flag 182 (block 624), as well as the RSV flag 150 of any other hardware thread specifying a matching store target address in its associated RSV address register 148 (block 626). It should be noted that in this exemplary embodiment a STCX request only cancels the reservations of other hardware threads at block 626 after it is verified that the STCX is going to succeed in its conditional update of shared memory. Thereafter, RC machine 142 is released to return to the idle state (block 618), and the process of FIG. 6A ends at block 630.

With reference now to FIG. 6B, there is depicted a high-level logical flowchart of an exemplary method of processing a STORE request in an RC state machine of a lower level cache (e.g., L2 cache 130) in accordance with one embodiment. The process of FIG. 6B begins at block 650 and then proceeds to block 652, which illustrates an RC machine 142 receiving a STORE request issued from L2 STQ 166, for example, at block 564 of FIG. 5B.

In response to receipt of a STORE request, the dispatched RC machine 142 transitions to the busy state and resets the RSV flag 150 of any hardware thread other than the initiating hardware thread that specifies a matching store target address in its associated RSV address register 148 (block 656). RC machine 142 additionally determines whether or not the store target address of the STORE request hits in L2 storage array and directory 140 in a writeable coherence state that confers authority on L2 cache 130 to modify the target cache line (block 660). If so, the process passes to block 664, which is described below. If not, RC machine 142 obtains authority to modify the target cache line and, if necessary, a copy of the target cache line from another cache hierarchy or memory controller 106 by issuing one or more requests on system interconnect 104 (block 662). At block 664, RC machine 142 updates the target cache line in L2 storage array and directory 140 with the store data of the STORE request. Thereafter, RC machine 142 is released to return to an idle state (block 666), and the process of FIG. 6B ends at block 670.

With reference now to FIG. 7, there is illustrated a high-level logical flowchart of an exemplary method by which the L2 cache 130 of a processing unit 102 services a request snooped from a system interconnect in accordance with one embodiment. Those skilled in the art will appreciate that multiple instances of this process can be active in a given L2 cache 230 concurrently. As depicted, the process begins at block 700 and thereafter proceeds to block 702, which illustrates an L2 cache 130 snooping a request (e.g., issued by anther processing unit 102) on system interconnect 104 via snoop bus 170. Following block 702, the process of FIG. 7 splits into three concurrent parallel subprocesses—a reservation logic update subprocess depicted at blocks 704-708 in which the effect, if any, of the snooped request on pending reservations tracked in the L2 reservation logic 146 is managed, an RC reservation update subprocess shown at block 720-724 in which the effect, if any, of the snooped request on pending reservations tracked by RC machines 142 is managed, and a request servicing subprocess at blocks 710-718 in which the snooped request is serviced by the snooping L2 cache 130, if necessary. Following completion of all of these three subprocesses, the subprocesses merge at join point 719, and process of FIG. 7 ends at block 730.

Referring first to the reservation logic update subprocess, the snooping L2 cache 130 determines at block 704 whether or not the snooped request is a store-type request that modifies or requests authority to modify shared memory. If not, no update to any local reservation tracked by L2 reservation logic 146 is required, and the reservation update subprocess proceeds to join point 719. If, however, the snooped request is a store-type request that indicates the intention to modify a target cache line, L2 cache 130 resets the RSV flag(s) 150 associated with any of its RSV address registers 148 that store(s) the address of the target cache line (blocks 706-708). Following either block 706 or block 708, the reservation logic update subprocess proceeds to join point 719.

Referring now to block 720, in the RC reservation update subprocess, L2 cache 130 determines whether or not the snooped request is a store-type request that modifies or requests authority to modify shared memory and has the authority to override a local processor core request being processed by an RC machine 142. If not, the process passes from block 720 directly to join point 719. If, however, L2 cache 130 determines at block 720 that the snooped request is a store-type request that modifies or requests authority to modify shared memory and has the authority to override a local processor core request being processed by an RC machine 142, L2 cache 130 resets the RC_RSV flag 182 of each RC machine 142, if any, for which the target address of the snooped request matches the reservation address specified in RC_addr register 180 (blocks 722-724). Thereafter, the process passes to join point 719.

Referring now to the request servicing subprocess, L2 cache 130 determines at block 710 whether or not servicing the snooped request requires allocation of a SN machine 144. If not, no SN machine 144 is dispatched to service the snooped request. The L2 cache 130 will nevertheless provide the appropriate coherence response, if any (block 711). The request servicing subprocess then proceeds to join point 719. If, however, L2 cache 130 determines at block 710 that a SN machine 144 is required to service the snooped request, L2 cache 130 further determines at block 712 whether or not a SN machine 144 can presently be dispatched. In order to dispatch a SN machine 144, a SN machine 144 must be available (i.e., in the idle state) and no RC machine 146 or SN machine 144 can be busy servicing a request having a target address matching that specified by the snooped request (among other dispatch constraints). Thus, for example, an RC machine 146 allocated to service a load-type request (as discussed above with reference to FIG. 4B) will prevent the dispatch of a local SN machine 144 to service a snooped request specifying a conflicting (i.e., matching) target address.

In response to a determination at block 712 that a SN machine 144 cannot presently be dispatched to service the snooped request, L2 cache 130 provides a Retry coherence response on system interconnect 104 to indicate its present inability to service the snooped request (block 714). (In response to this Retry coherence response, the source of the snooped request may later represent the request on system interconnect 104.) Following block 714, the request servicing subprocess proceeds to join point 719. If, however, L2 cache 130 determines at block 712 that a SN machine 144 can presently be dispatched to service the snooped request, L2 cache 130 dispatches an idle SN machine 144 to service the snooped request (block 716). The dispatched snoop machine 144 transitions from the idle state to the busy state and then performs at block 718 whatever additional processing is required to service the snooped request (e.g., updating L2 storage array and directory 140 and/or L1 cache 126, sourcing a copy of the target cache line, providing protocol-dependent coherence responses, etc.). Following completion of its processing at block 718, the SN machine 144 dispatched to service the snooped request transitions from the busy state to the idle state, and the request servicing subprocess proceeds to join point 719.

Figure 8:
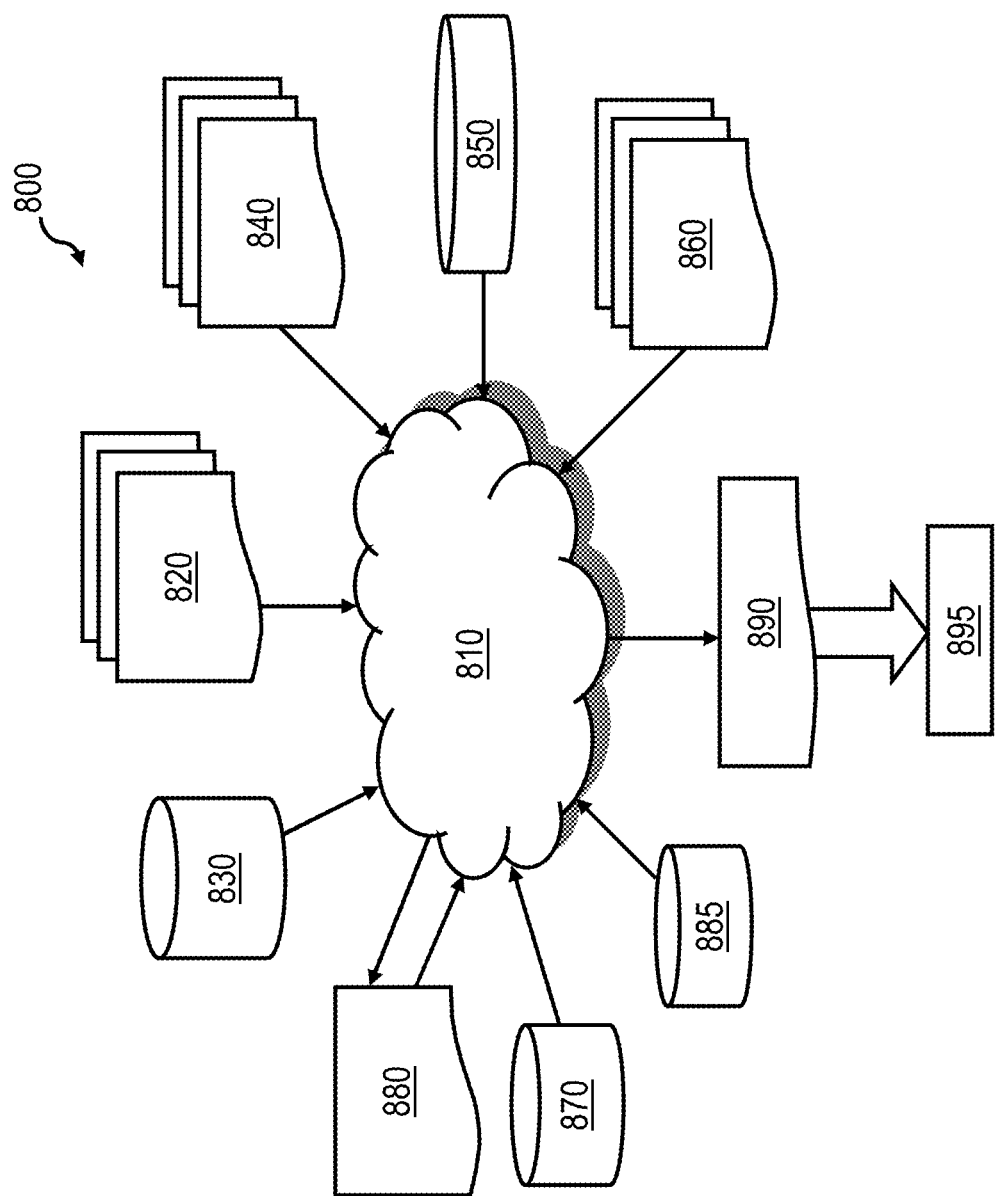
FIG. 8 is a block diagram of an exemplary design flow.

With reference now to FIG. 8, there is illustrated a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown herein. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 1020 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown herein. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown herein to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 80 nm, etc.). The data structure types may further include design specifications 840, characterization data 850, verification data 860, design rules 890, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 890 may comprise a compiled, executable HDL simulation model that functionally simulates the devices shown herein.

Design structure 890 may also employ a data format used for the exchange of layout data of integrated circuits and/or symbolic data format (e.g., information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 890 may then proceed to a stage 895 where, for example, design structure 890: proceeds to tape-out, is released to manufacturing, is released to a mask house, is sent to another design house, is sent back to the customer, etc.

As has been described, in at least one embodiment, a data processing system includes multiple processing units all having access to a shared memory. A processing unit for a data processing system includes a cache memory having reservation logic and a processor core coupled to the cache memory. The processor includes an execution unit that executes instructions in a plurality of concurrent hardware threads of execution including at least first and second hardware threads. The instructions include, within the first hardware thread, a first load-reserve instruction that identifies a target address for which a reservation is requested. The processor core additionally includes a load unit that records the target address of the first load-reserve instruction and that, responsive to detecting, in the second hardware thread, a second load-reserve instruction identifying the target address recorded by the load unit, blocks the second load-reserve instruction from establishing a reservation for the target address in the reservation logic.

While various embodiments have been particularly shown and described, it will be understood by those skilled in the art that various changes in form and detail may be made therein without departing from the spirit and scope of the appended claims and these alternate implementations all fall within the scope of the appended claims.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although a particular embodiment of a memory hierarchy has been described in which L1 and L2 caches are incorporated within a processing unit, those skilled in the art will appreciate that a greater or lesser number of levels of cache hierarchy may be employed. Further, these levels of cache hierarchy may include in-line or lookaside caches and may include one or more levels of off-chip cache. Further, the level of cache hierarchy at which coherency is determined may differ from that discussed with reference to the described embodiments.

Further, although aspects have been described with respect to a computer system executing program code that directs the functions of the present invention, it should be understood that present invention may alternatively be implemented as a program product including a computer-readable storage device storing program code that can be processed by a data processing system. The computer-readable storage device can include volatile or non-volatile memory, an optical or magnetic disk, or the like. However, as employed herein, a "storage device" is specifically defined to include only statutory articles of manufacture and to exclude signal media per se, transitory propagating signals per se, and energy per se.

The program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

What is claimed is:

1. A processing unit for a data processing system, said processing unit comprising:
a processor core that issues memory access requests; and
a cache memory coupled to the processor core to receive and process the memory access requests, the cache memory including a reservation circuit that tracks reservations established by the processor core via load-reserve requests and a plurality of read-claim (RC) state machines for servicing memory access requests of the processor core, wherein the cache memory, responsive to receipt from the processor core of a store-conditional request specifying a store target address for which a reservation is tracked in a the reservation circuit, allocates an RC state machine among the plurality of RC state machines to process the store-conditional request, updates a state of the RC state machine to indicate the reservation for the store target address, and resets the reservation for the store target address tracked in the reservation circuit while the state of the RC machine indicates the reservation, such that the reservation circuit can track a new reservation established by the processor core.

2. The processing unit of claim 1, wherein:
the processor core supports a plurality of simultaneous hardware threads;
the reservation circuit includes a plurality of reservation registers each associated with a respective one of the plurality of simultaneous hardware threads;
the store-conditional request is issued by a given hardware thread among the plurality of simultaneous hardware threads; and
the processor core is configured to issue to the cache memory the store-conditional request, thereafter issue to the cache memory a load-reserve request of the given hardware thread, and thereafter receive from the cache memory a pass/fail indication for the store-conditional request.

3. The processing unit of claim 1, wherein:
the processing unit is configured to be coupled to a system interconnect of the data processing system; and
the cache memory is configured to, based on snooping a memory access request on the system interconnect, reset the reservation for the store target address tracked by the read-claim state machine.

4. The processing unit of claim 1, wherein:
the processor core includes a register set; and
the processor core is configured to only issue a load-reserve request of a given hardware thread to the cache memory to establish a reservation for a load target address based on any prior load-reserve requests of the given hardware thread having data loaded into the register set.

5. The processing unit of claim 1, wherein:
the cache memory includes a load queue having at least one entry to buffer load-reserve requests of the processor core; and
the cache memory only issues a load-reserve request of a given hardware thread from the load queue to one of the plurality of read-claim state machines for processing based on resolution of a store dependency between the load-reserve request and a store-conditional request of the given hardware thread that is buffered in a store queue of the processing unit.

6. The processing unit of claim 5, wherein the store queue is a disposed in the processor core.

7. A data processing system, comprising:
multiple processing units, including the processing unit of claim 1;
a shared memory; and
a system interconnect communicatively coupling the shared memory and the multiple processing units.

8. A design structure tangibly embodied in a machine-readable storage device for designing, manufacturing, or testing an integrated circuit, the design structure comprising:
a processing unit for a data processing system, said processing unit including:
a processor core that issues memory access requests; and
a cache memory coupled to the processor core to receive and process the memory access requests, the cache memory including a reservation circuit that tracks reservations established by the processor core via load-reserve requests and a plurality of read-claim (RC) state machines for servicing memory access requests of the processor core, wherein the cache memory, responsive to receipt from the processor core of a store-conditional request specifying a store target address for which a reservation is tracked by the reservation circuit, allocates an RC state machine among the plurality of RC state machines to process the store-conditional request, updates a state of the RC state machine to indicate the reservation for the store target address, and resets the reservation for the store target address tracked in the reservation circuit while the state of the RC machine indicates the reservation, such that the reservation circuit can track a new reservation established by the processor core.

9. The design structure of claim 8, wherein:
the processor core supports a plurality of simultaneous hardware threads;
the reservation circuit includes a plurality of reservation registers each associated with a respective one of the plurality of simultaneous hardware threads;
the store-conditional request is issued by a given hardware thread among the plurality of simultaneous hardware threads; and
the processor core is configured to issue to the cache memory the store-conditional request, thereafter issue to the cache memory a load-reserve request of the given hardware thread, and thereafter receive from the cache memory a pass/fail indication for the store-conditional request.

10. The design structure of claim 8, wherein:
the processing unit is configured to be coupled to a system interconnect of the data processing system; and
the cache memory is configured to, based on snooping a memory access request on the system interconnect, reset the reservation for the store target address tracked by the read-claim state machine.

11. The design structure of claim 8, wherein:
the processor core includes a register set; and
the processor core is configured to only issue a load-reserve request of a given hardware thread to the cache memory to establish a reservation for a load target address based on any prior load-reserve requests of the given hardware thread having data loaded into the register set.

12. The design structure of claim 8, wherein:
the cache memory includes a load queue having at least one entry to buffer load-reserve requests of the processor core; and
the cache memory only issues a load-reserve request of a given hardware thread from the load queue to one of the plurality of read-claim state machines for processing based on resolution of a store dependency between the load-reserve request and a store-conditional request of the given hardware thread that is buffered in a store queue of the processing unit.

13. The design structure of claim 12, wherein the store queue is a disposed in the processor core.

14. A method of data processing in a processing unit of a data processing system, the processing unit including a processor core and a cache memory coupled to the processor core, the cache memory including a reservation circuit that tracks reservations established by the processor core via load-reserve requests and a plurality of read-claim (RC) state machines for servicing memory access requests of the processor core, said method comprising:
the processor core issuing memory access requests to the cache memory; and
the cache memory, responsive to receipt from the processor core of a store-conditional request specifying a store target address for which a reservation is tracked by the reservation circuit, allocates an RC state machine among the plurality of RC state machines to process the store-conditional request, updates a state of the RC state machine to indicate the reservation for the store target address, and resets the reservation for the store target address tracked in the reservation circuit while the state of the RC machine indicates the reservation, such that the reservation circuit can track a new reservation established by the processor core.

15. The method of claim 14, wherein:
the processor core supports a plurality of simultaneous hardware threads;
the reservation circuit includes a plurality of reservation registers each associated with a respective one of the plurality of simultaneous hardware threads;
the store-conditional request is issued by a given hardware thread among the plurality of simultaneous hardware threads; and
the issuing includes the processor core issuing to the cache memory a load-reserve request of the given hardware thread after issuing the store-conditional request; and
the method further comprises the processor core, after issuing the load-reserve request, receiving from the cache memory a pass/fail indication for the store-conditional request.

16. The method of claim 14, wherein:
the processing unit is configured to be coupled to a system interconnect of the data processing system; and
the method further comprises the cache memory, based on snooping a memory access request on the system interconnect, resetting the reservation for the store target address tracked by the read-claim state machine.

17. The method of claim 14, wherein:
the processor core includes a register set; and
the issuing includes the processor core only issuing a load-reserve request of a given hardware thread to the cache memory to establish a reservation for a load target address based on any prior load-reserve requests of the given hardware thread having data loaded into the register set.

18. The method of claim 14, wherein:
the cache memory includes a load queue having at least one entry to buffer load-reserve requests of the processor core; and
the method further comprises the cache memory only issuing a load-reserve request of a given hardware thread from the load queue to one of the plurality of read-claim state machines for processing based on resolution of a store dependency between the load-reserve request and a store-conditional request of the given hardware thread that is buffered in a store queue of the processing unit.

19. The method of claim 18, wherein the store queue is a disposed in the processor core.

20. The processing unit of claim 1, wherein:
the store target address is a first store target address;
the reservation circuit includes a plurality of reservation registers, including a particular reservation register assigned to the first store target address; and
the cache memory is configured to allocate the particular reservation register to a different second store target address while the reservation for the first store target address is indicated by the state of the RC machine.

21. The processing unit of claim 1, wherein the cache memory is configured to update the state of the RC machine to indicate the reservation by setting a reservation flag of the RC machine.

* * * * *